United States Patent
Tio Castro et al.

(10) Patent No.: US 9,190,611 B2
(45) Date of Patent: Nov. 17, 2015

(54) ELECTRONIC DEVICE, AND METHOD OF MANUFACTURING AN ELECTRONIC DEVICE

(75) Inventors: David Tio Castro, Heverlee (BE); Almudena Huerta, Leuven (BE)

(73) Assignee: NXP B.V., Eindhoven (NL)

( * ) Notice: Subject to any disclaimer, the term of this patent is extended or adjusted under 35 U.S.C. 154(b) by 381 days.

(21) Appl. No.: 12/665,840

(22) PCT Filed: Jun. 20, 2008

(86) PCT No.: PCT/IB2008/052441
§ 371 (c)(1),
(2), (4) Date: Dec. 21, 2009

(87) PCT Pub. No.: WO2009/001261
PCT Pub. Date: Dec. 31, 2008

(65) Prior Publication Data
US 2010/0176364 A1    Jul. 15, 2010

(30) Foreign Application Priority Data

Jun. 28, 2007    (EP) ..................................... 07111317

(51) Int. Cl.
*H01L 29/02*    (2006.01)
*H01L 45/00*    (2006.01)
(Continued)

(52) U.S. Cl.
CPC ............. *H01L 45/1226* (2013.01); *B82Y 10/00* (2013.01); *G11C 13/0004* (2013.01); *H01L 45/06* (2013.01); *H01L 45/1246* (2013.01); *H01L 45/144* (2013.01);
(Continued)

(58) Field of Classification Search
CPC ......... H01L 45/04; H01L 29/00; H01L 27/24; G11C 13/0004
USPC .................... 257/2–5, E29.002; 438/102–104
See application file for complete search history.

(56) References Cited

U.S. PATENT DOCUMENTS 5,933,365 A * 8/1999 Klersy et al. .................. 365/148
5,985,698 A * 11/1999 Gonzalez et al. ............. 438/128
(Continued)

FOREIGN PATENT DOCUMENTS

EP    1469532 A1    10/2004
EP    1724850 A2    11/2006
(Continued)

OTHER PUBLICATIONS

Terminal. (n.d.) The American Heritage® Dictionary of the English Language, Fourth Edition. (2003). Retrieved May 20, 2012 from http://www.thefreedictionary.com/terminal.*
(Continued)

*Primary Examiner* — Jami M Valentine

(57) ABSTRACT

An electronic device (100), the electronic device (100) comprising a substrate (101), a convertible structure (102) arranged on and/or in the substrate (101), being convertible between at least two states by heating and having different electrical properties in different ones of the at least two states, wherein the convertible structure (102) has a first portion having a first width (w1), and has a second portion having a second width (w2), the second width (w2) being smaller than the first width (w1), and a protrusion (108) protruding through the convertible structure (102) to thereby narrow the second portion of the convertible structure (102) from the first width (w1) to the second width (w2).

22 Claims, 14 Drawing Sheets

(51) Int. Cl.
*B82Y 10/00* (2011.01)
*G11C 13/00* (2006.01)

(52) U.S. Cl.
CPC ......... *H01L 45/148* (2013.01); *H01L 45/1675* (2013.01); *G11C 2213/16* (2013.01); *G11C 2213/79* (2013.01)

(56) References Cited

U.S. PATENT DOCUMENTS

| | | |
|---|---|---|
| 6,534,780 B1 | 3/2003 | Gonzalez et al. |
| 2004/0113181 A1 | 6/2004 | Wicker |
| 2004/0166604 A1* | 8/2004 | Ha et al. ................. 438/102 |
| 2005/0001284 A1 | 1/2005 | Pellizzer |
| 2006/0054991 A1 | 3/2006 | Kuo et al. |
| 2006/0169968 A1 | 8/2006 | Happ |
| 2006/0226409 A1 | 10/2006 | Burr et al. |
| 2006/0261321 A1 | 11/2006 | Happ et al. |

FOREIGN PATENT DOCUMENTS

| | | |
|---|---|---|
| EP | 1780814 A2 | 5/2007 |
| WO | 2006108541 A1 | 10/2006 |

OTHER PUBLICATIONS

Intermediate. (n.d.) The American Heritage® Dictionary of the English Language, Fourth Edition. (2003). Retrieved May 20, 2012 from http://www.thefreedictionary.com/intermediate.*

Merget, F., et al.; "Lateral Phase Change Random Access Memory Cell Design for Low Power Operation"; Microsystem Technologies; Micro and Nanosystems Information Storage and Processing Systems; Springer, Berlin, DE, vol. 13, No. 2; Apr. 5, 2006; pp. 169-172; XP019461439; ISSN: 1432-1858.

Ly, Hangbing, et al; "A Nano-Scale-Sized 3D Element for Phase Change Memories"; Semiconductor Science and Technology, vol. 21, No. 8; pp. 1013-1017; ISSN: 0268-1242.

Ottogalli, F., et al; "Phase Change Memory Technology for Embedded Applications"; Solid-State Device Research Conference, 2004; Proceeding of the 34th European, Leuven, Belgium; Sep. 21-23, 2004; IEEE; Piscataway, NJ, US; pp. 293-296; ISBN: 0-7803-8478-4.

* cited by examiner

ELECTRONIC DEVICE, AND METHOD OF MANUFACTURING AN ELECTRONIC DEVICE

FIELD OF THE INVENTION

The invention relates to an electronic device.

Moreover, the invention relates to a method of manufacturing an electronic device.

BACKGROUND OF THE INVENTION

In the field of non-volatile memories, flash memory scaling beyond a 45 nm node has become a real issue. Technologies to face this challenge are ferroelectric, magnetic and phase change memories, the latter one being promising for the replacement of flash and showing characteristic that may allow replacement of other types of memories such as DRAM. Phase change memories are a possible solution for the unified memory being an important step in the electronics art. OTP ("on time programmable") and MTP ("multiple times programmable") memories open a field that may present a great opportunity for phase change memories as well.

Phase change memories are based on a reversible memory switching using, for instance, chalcogenide materials. So termed "nucleation dominated" material GeTe—$Sb_2Te_3$ tie line, such as $Ge_2Sb_2Te_5$, may be used in ovonic unified memory (OUM) devices. In this concept, the phase change material may be in contact with a bottom-resistive electrode to switch reversibly to a small volume of phase change material. In another application the active part of a memory device may be a phase change line formed in between two electrodes formed in the back end of line processing (BEOL) of a CMOS-based front end of line (FEOL).

Thus, phase change materials may be used to store information. The operational principle of these materials is a change of phase. In a crystalline phase, the material structure is, and thus properties are, different from the properties in the amorphous phase.

The programming of a phase change material is based on the difference between the resistivity of the material and its amorphous and crystalline phase. To switch between both phases, an increase of the temperature is required. Very high temperatures with rapid cooling down will result in an amorphous phase, whereas a smaller increase in temperature or slower cooling down leads to a crystalline phase. Sensing the different resistances may be done with a small current that does not cause substantial heating.

The increase in temperature may be obtained by applying a pulse to the memory cell. A high current density caused by the pulse may lead to a local temperature increase. Depending on the duration and amplitude of the pulse, the resulting phase will be different. A fast cooling and large amplitude may quench the cell in an amorphous phase, whereas a slow cooling down and a smaller amplitude pulse may allow the material to crystallize. Larger pulse amplitudes, so-called RESET pulses, may amorphize the cells, whereas smaller pulse amplitudes will SET the cell to its crystalline state, these pulses are also called SET pulses.

EP 1,469,532 discloses a process for manufacturing a phase change memory cell, comprising the steps of forming a resistive element, forming a delimiting structure having an aperture over the resistive element, forming a memory portion of a phase change material in the aperture, the resistive element and the memory portion being in direct electrical contact and defining a contact area of sub-lithographic extension. The step of forming a memory portion further includes filling the aperture with the phase change material and removing from the delimiting structure an exceeding portion of the phase change material exceeding the aperture.

However, programming conventional memory cells may require high power consumption.

OBJECT AND SUMMARY OF THE INVENTION

It is an object of the invention to provide an electronic component having a convertible structure that can be programmed with reasonable power consumption.

In order to achieve the object defined above, an electronic device and a method of manufacturing an electronic device according to the independent claims are provided.

According to an exemplary embodiment of the invention, an electronic device is provided comprising a substrate, a convertible structure arranged (for instance in a planar manner) on and/or in the substrate, being convertible between at least two states by heating and having different electrical properties in different ones of the at least two states, wherein the convertible structure has a first portion having a first width, and has a second portion having a second width, the second width being smaller than the first width, and a protrusion (such as a post or pillar) protruding through the convertible structure to thereby narrow the second portion of the convertible structure from the first width to the second width.

According to another exemplary embodiment of the invention, a method of manufacturing an electronic device is provided, the method comprising arranging a convertible structure (for instance in a planar manner) on and/or in a substrate, the convertible structure being convertible between at least two states by heating and having different electrical properties in different ones of the at least two states, forming the convertible structure to have a first portion having a first width and to have a second portion having a second width, the second width being smaller than the first width, and forming a protrusion protruding through the convertible structure to thereby narrow the second portion of the convertible structure from the first width to the second width.

The term "electronic device" may particularly denote any component, member or apparatus that fulfils any electric, magnetic and/or electronic functionality. This means that electric, magnetic and/or electromagnetic signals may be applied to and/or generated by the electronic device during regular use.

The term "convertible structure" may particularly denote any physical structure having convertible properties. Examples are a phase change structure or a structure with thermo-dependent properties. Phase change materials can have not only two phases but also more than two phases, for instance crystalline, amorphous, meta-amorphous, meta-crystalline, crystalline with a different lattice orientation, etc.

The term "phase change structure" may particularly denote any physical structure that has the property to change any physical parameter or material property under the influence of heat (generated by ohmic losses of an electric current flowing through the phase change structure or an electrically/a thermally coupled heating element, and/or generated by the absorption of electromagnetic radiation). This may particularly mean a switch of a material such as a chalcogenide between an amorphous configuration and a crystalline configuration, which may be accompanied by a significant change in the electrical resistivity. However, any other phase changes such as a change from a solid to a liquid phase, which phase changes are connected with a change of a physical property, may be covered by this term.

The term "memory cell" may particularly denote a physical structure (such as a layer sequence, for instance monolithically integrated in a substrate such as a silicon substrate) that allows storing information in an electronic manner. An amount of information stored in a memory cell may be 1 bit (particularly when the phase change material is switched between two phases representing logical values "1" or "0") or may be more than 1 bit (particularly when the phase change material is switched between at least three phases). The memory cell may be formed on and/or in a substrate that may denote any suitable material, such as a semiconductor, glass, plastic, etc.

The term "substrate" may be used to define generally the elements for layers that underlie and/or overlie a layer or portions of interest. Also, the substrate may be any other base on which a layer is formed, for example a semiconductor wafer such as a silicon wafer or silicon chip.

The term "nanowire" may denote a wire-like structure of dimensions in the order of magnitude of several nanometers to several hundreds of nanometers (and may also cover larger or smaller dimensions). Many different types of nanowires may be used for embodiments of the invention, including semiconducting nanowires (for instance made of silicon, germanium, InP, GaN, etc.), metallic nanowires (for instance nickel, platinum, gold), and nanotubes, particularly carbon nanotubes (intrinsic or doped). According to an exemplary embodiment of the invention, such nanowires may form the protrusion. The nanowire may also be an isolating nanowire (in case the nanowire is covered by an isolation layer).

The term "protrusion" may particularly denote a three-dimensional physical structure that penetrates through the convertible structure so as to selectively reduce a width of the convertible structure where the penetration occurs. Such a protrusion may be a pillar or a post and may have any kind of shape such as a cylindrical shape, a cuboid, etc. Particularly, the protrusion may be formed of a non-conductive material.

The term "width" of the convertible structure may denote, in a planar configuration, a dimension in a horizontal direction perpendicular to a current flow (which may occur along a connection line between two electrodes) through the convertible structure and perpendicular to a vertical thickness of the convertible structure.

According to an exemplary embodiment of the invention, a layer-like convertible structure may be selectively narrowed in a specific region to thereby locally increase the resistance by laterally constricting a current flow path which may reduce the power consumption for switching the convertible structure (such as a phase change material) between different states (such as a crystalline state and an amorphous state). This may allow increasing the resistance of the phase change line without increasing the consumption of silicon area. Furthermore, the programming power may be reduced. A self-aligned process, avoiding large amounts of processing related problems, may form such a device. Furthermore, such a structure can be manufactured with low costs, since no extra masks are required.

The electronic device may comprise one or more protrusions or pillars protruding through the convertible structure in a vertical manner to thereby shorten/modify a portion of the convertible structure from the first width to the second width. For instance, the convertible structure may be manufactured by a simple deposition and lithography procedure with a constant width. By means of the protrusion (which may be deposited or grown), this width can be reduced to increase locally the resistance of the convertible structure. Since the width of the convertible structure can be reduced by the protrusion that can be freely shifted in a layout, the width of the convertible structure may be reduced locally by the overlapping protrusion, thereby allowing to achieve sub-lithographic dimensions of phase change material.

Exemplary fields of exemplary embodiments of the invention are phase change memories. However, embodiments of the invention may be used in any electronic device in which the shape plays an important role and needs to be modified and shrunk within a sub-lithography range.

According to an exemplary embodiment of the invention, a memory cell is provided comprising a line structure of phase change material, the line structure having a main width (profile), wherein the line structure may comprise at least one section having a second width (profile) that is smaller than the main width (profile). According to an exemplary embodiment, the main width may be in the range of lithography dimensions and the second width may be below lithography dimensions in that at least one pillar is present to constitute a hole within the line structure resulting in a section having the second width or profile.

According to an exemplary embodiment of the invention, a sub-lithography phase change line cell with nanopillars may be provided. Phase change materials need high temperature to switch from an amorphous to a crystalline state. This may be done by Joule heating, that is to say an electric current causes the material to heat. An option to reduce power consumption and at the same time scale a memory cell to smaller nodes is the reduction of the width of the phase change line. This reduction in width allows shrinking the current through the phase change material while keeping the same current density. The resistance of the cell is also increased as the width is reduced. High resistive phase change lines allow resistance matching with transistors of more advanced nodes. Power consumption and scalability are improved. Reducing the width of a phase change line is made by placing the nanopillar within the limits of a phase change line. Such a cell may be manufactured in a self-aligned manner, so that the phase change material is prevented from being chemically touched during processing, improving and stability.

Exemplary embodiments of the invention may be implemented in devices in which the shape plays an important role and needs to be modified and shrunk to the sub-lithography range. Self-aligned characteristic of embodiments of the invention may give it a strong point to be used in a conventional manufacturing process since the extra cost of mask may be reduced (only one extra mask, or even no extra mask with regard to current phase change technology). Possible applications are phase change materials, but also other memories or electronic devices implementing a convertible structure.

Next, further exemplary embodiments of the electronic device will be explained. However, these embodiments also apply to the method of manufacturing an electronic device.

The convertible structure may form a thermo-dependent structure, particularly a phase change structure that is convertible between at least two phase-states. Thus, under the influence of heat which may be generated by ohmic losses of a programming current flowing through the phase change structure and/or electrodes connected thereto, the switch between the two phases can be initiated. Thermal energy may also be supplied via electromagnetic radiation. However, thermal energy can be also supplied by a contiguous structure/heater.

Particularly, the phase change structure may be adapted such that a value of the electrical conductivity differs between the two phase-states. In one of the at least two phase states, the phase change structure may be electrically conductive (for instance essentially metallically conductive). In the other phase state, the electrical conductivity may be larger or lower than in the first state, for instance the phase change structure may be superconductive or may be semiconductive or may be isolating or may be conductive as well with a modified value of conductivity. In a normal operation of the electronic component, the function of the electronic device will be influenced, will be defined or will depend on the present value of the electrical conductivity of the phase change structure. This may allow manufacturing memory cells, switches, actuators, sensors, etc. using the different value of the electrical conductivity of the phase change structure in the different phase modes.

By a conversion signal (such as a current pulse or a current signal and/or a voltage pulse or a voltage signal or an electromagnetic signal) heat may be generated in a convertible material to thereby change its phase state and consequently its value of the electrical conductivity. The applied conversion signals, for instance current pulses, may have a certain shape (for instance may have a fast raising edge and a slow falling edge, or may have a raising edge which is curved to the right and a falling edge which is curved to the left) and may be characterized by different parameters (such as current amplitude, pulse duration, etc.). By adjusting the parameters of the conversion signal, it is possible to control whether the phase change material is converted into a crystalline phase or is converted into an amorphous phase. Very high temperatures with rapid cooling down may result in an amorphous phase. A smaller increase in temperature or slower cooling down may lead to a crystalline phase.

The phase change structure may be adapted such that one of the two phase states relates to a crystalline phase and the other one of the two phase states relates to an amorphous phase of the phase change structure. Such a material property can be found in chalcogenide materials. A chalcogenide glass may be used which is a glass containing a chalcogenide element (sulphur, selenium or tellurium) as a substantial constituent. Examples for phase change materials are GeSbTe, AgInSbTe, InSe, SbSe, SbTe, InSbSe, InSbTe, GeSbSe, GeSbTeSe or AgInSbSeTe.

The electronic device may comprise an electric sensing circuitry adapted for sensing the different electrical properties of the convertible structure in different ones of the at least two states. For instance, a test voltage may be applied to the convertible structure, and a current flowing along the convertible structure will depend on the phase state of the convertible structure, since the electrical conductivity is different in the crystalline and in the amorphous phase. Such a sensing circuitry may also include selection transistors or other kinds of switches that selectively enable or disable access to a particular electronic component of an array of electronic components. Thus, a respective selection transistor may be assigned to each one of the electronic components.

The electronic device may comprise a first electrode and a second electrode, the convertible structure being electrically connected between the first electrode and the second electrode. Therefore, by means of the electrodes, current may be conducted to the convertible structure to either sense information stored in the convertible structure or to change the state of the convertible structure by Joule heating.

The convertible structure may be arranged on and/or in the substrate in a planar manner. Thus, the phase change material may be deposited in a horizontal manner on a planar surface of the substrate, thereby forming a planar layer of the convertible material. Limits of the layer of phase change material may be defined lithographically. The insulating pillar may pierce or protrude through such a planar layer of convertible material.

The protrusion may be aligned vertically with respect to the substrate. By providing a vertically aligned protrusion, it is also possible to manufacture the protrusion before manufacturing the convertible structure, thereby allowing for a deposition of phase change material on the substrate as a basis for the electronic device and to electrically decouple material on top of the protrusion to spatially narrow the convertible structure in an environment of the protrusion. By arranging the convertible structure in a planar configuration and the protrusion in a vertical configuration, the protrusion will not consume any additional silicon area; rendering the device cheap in manufacture and promoting an increased integration density.

It may be particularly advantageous to provide the protrusion in an oblong manner, that is to say with an aspect ratio (length divided by diameter) of much larger than one, particularly at least 5, more particularly at least 8. Then, first growing the vertical oblong protrusion and subsequently depositing a planar layer of convertible material will result in lateral walls of the protrusion being free of convertible material.

The protrusion may protrude through a central portion of the convertible structure, to thereby form an island within the convertible structure, that is to say a protrusion being surrounded along an entire perimeter by convertible material. This may force a current to move along two very narrow portions on the left-hand side and on the right-hand side of the island-shaped post, thereby significantly increasing resistance and decreasing power consumptions for switching the convertible structure between the states. Alternatively, it is possible to provide the one or more protrusions at lateral end portions of the convertible structure that overlap partially with the convertible structure. Such an overlap configuration may allow to obtain a sub-lithographic second width, even when the first width and the diameter of the protrusion are defined by lithography.

The protrusion may comprise an electrically insulating material such as silicon oxide ($SiO_2$) or silicon nitride ($Si_3N_4$). By providing the protrusion from an electrically insulating material, it does not influence the current flow through the convertible structure.

The protrusion may comprise a nanowire grown on the substrate. By providing a nanowire, for instance a semiconductor nanowire, a carbon nanotube, a silicon nanowire, or a group III-group V nanowire (for instance made from gallium arsenide), it is possible to manufacture the protrusion with a dimension that is smaller than a lithographic limit. Such a nanowire may be grown on a precursor/catalyst spot (for instance an iron or nickel catalyst for growing carbon nanotubes) that may be spotted on the substrate or in a trench thereof, therefore allowing for spatially limited growth of the nanowire.

Alternatively, the protrusion may comprise a lithographically manufactured structure. In other words, a structure of material serving as a basis for the protrusion may be deposited and partially removed by a lithography procedure. When the protrusion is provided at a lateral end portion of the convertible structure, it is possible to narrow the convertible structure without sub-lithographic procedures.

The substrate may have a trench in which the protrusion and the convertible structure may be formed. By forming these components in the trench, it is possible to prevent the sensitive structures against damages resulting from mechanical forces.

The protrusion and the convertible structure may be formed on a trenchless portion of the substrate, that is to say a surface portion of a substrate being free of trenches. Such a configuration may allow for an easy manufacture, since no trench formation is required.

The protrusion may be a stepped structure having one or more steps at a first height above the substrate, and having a plateau at a second height above the substrate, wherein the second height is larger than the first height, wherein the convertible structure is arranged on the step(s). Such a configuration may allow to manufacture convertible structures having very small dimensions, since steps which can be formed on portions of the protrusions may serve as a substrate on which a convertible material is provided. Such an embodiment may also allow manufacturing phase change material in sub-lithographic dimensions.

Also the convertible structure may comprise a lithographically manufactured structure. This may allow manufacturing the convertible structure with low effort, and in combination particularly with a growing procedure for producing the protrusion, this may allow for a high performance.

The device may comprise a plurality of protrusions protruding through different portions of the convertible structure. By taking this measure, it may be possible to accurately define current paths and resistance characteristics of the convertible structure and to further increase the integration density.

The electronic device may be adapted as a memory device. In such a memory device, the information of one or more bits may be stored in the present phase of the phase change material, particularly depending on the present one of two or more phase states of the phase change structure.

The electronic device may also be adapted as a memory array, that is a configuration of a (large) plurality of memory devices of the aforementioned type. In such a memory array, the memory cells may be arranged in a matrix-like manner and may be controlled via bit lines and word lines with transistors serving as switches to get or prevent access to desired individual memory cells and memory devices. The multiple memory cells may be monolithically integrated in a common (for instance silicon) substrate.

The electronic component may also serve as an actuator, since a change of the electrical conductivity of the phase change structure may result in a modification of an actuation signal.

It is also possible to adapt the electronic component as a microelectromechanical structure (MEMS). An electrical signal modified by a phase change of the convertible material may result in a specific motion of a movable component of the microelectromechanical structure (MEMS).

It is clear that the modification of the phase change material, and therefore of its electrical conductivity, may be used to construct controllers, switches, transductors, etc.

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on a purely crystalline silicon wafer or on an SOI wafer (Silicon On Insulator).

Any process technologies like CMOS, BIPOLAR, BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
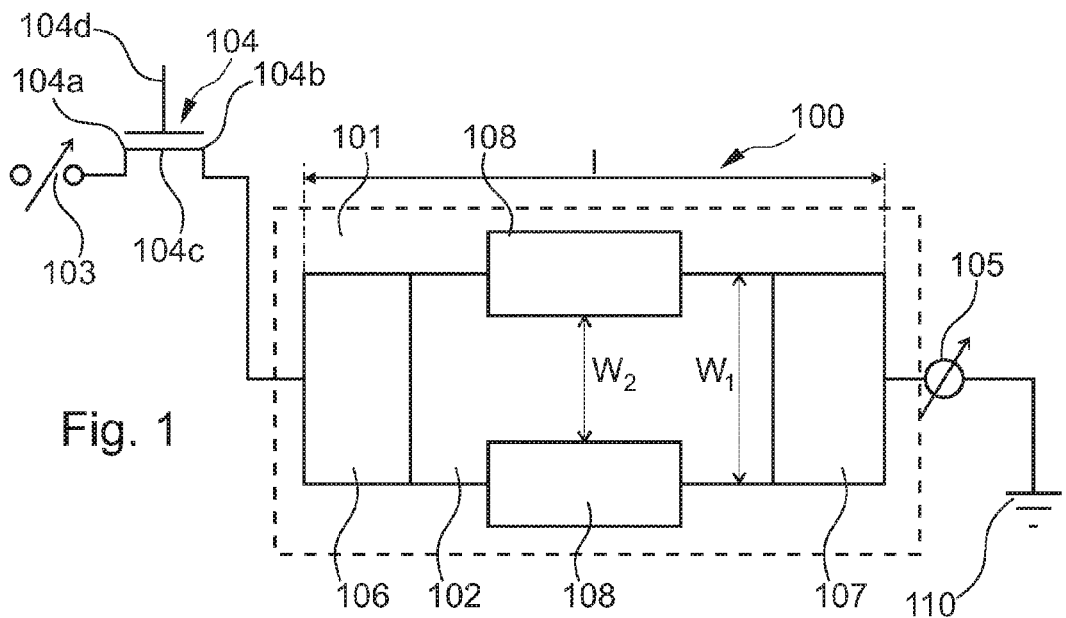
FIG. 1 illustrates an electronic memory cell device according to an exemplary embodiment of the invention.

The illustration in the drawing is schematical. In different drawings, similar or identical elements are provided with the same reference signs.

In the following, referring to FIG. 1, a memory cell 100 according to an exemplary embodiment of the invention will be explained. FIG. 1 shows a plan view of the memory cell 100.

The memory cell 100 comprises a silicon substrate 101 and a pattern layer of a phase change material structure 102 arranged in a planar manner on a surface of the silicon substrate 101. The phase change material 102 is convertible between a crystalline state and an amorphous state by heating and has different electrical properties (particularly different values of the conductivity) in the different states.

As can be taken from FIG. 1, the phase change material 102 has a basically rectangular shape with a length l and a general first width w1. However, in a central portion of the phase change material 102, the width is reduced to a second width w2<w1 by two protrusions 108 provided on two lateral end positions of the phase change material 102. The protrusions 108 are made of silicon oxide material that is lithographically manufactured.

Under the influence of an electric current which may flow between a first electrode 106 and a second electrode 107 through the phase change material structure 102, it is possible to detect the present state of the phase change material 102 by means of a small sensing current, and it is possible to switch between the states of the phase change material 102 by means of a larger programming current.

An electric sensing circuit formed by coupled components 103 to 105 is provided for sensing the different electrical properties of the phase change material 102 and for switching between different ones of the two states. For this purpose, a current source 103 having a variable current is provided. A switch transistor 104 is provided having the source/drain regions 104a, 104b and the channel region 104c between the current source 103 and the first electrode 106. By modifying a switch voltage applied to a gate 104d of the transistor 104, it is possible to select or deselect the memory cell 100 which may be part of a memory array such as the memory array 200 shown in FIG. 2.

When the switch 104 is closed, a current generated by the current source 103 may flow from the first electrode 106 through the convertible structure 102 to the second electrode 107. The flowing voltage or current value may be detected or measured by a voltage or current measurement device 105 which is connected between the second electrode 107 and a reference potential such as a ground potential 110.

The protrusions 108 protrude/penetrate vertically (that is to say are aligned vertically to the paper plane of FIG. 1) through the planar convertible structure 102 to thereby spatially narrow a middle portion of the convertible structure 102 from the first width w1 to the second width w2.

In the present embodiment, only the components 106 to 108, 102 are formed on the substrate 101. However, it is also possible that the switch transistor 104, the current source 103 and/or the measurement device 105 is/are arranged on or is/are monolithically integrated in the silicon substrate 101.

Figure 2:
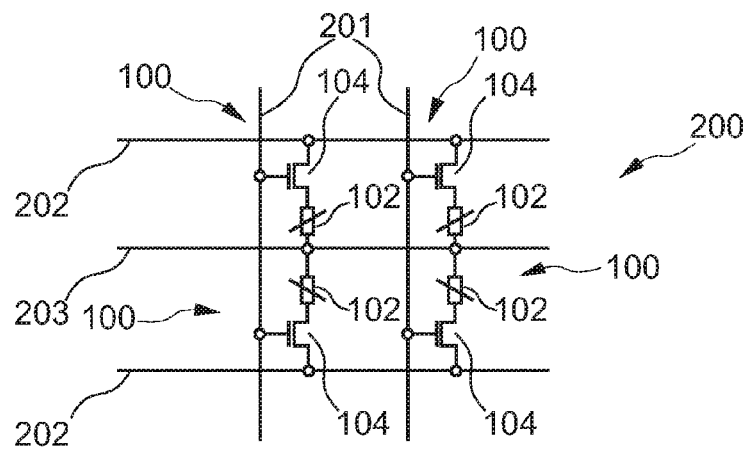
FIG. 2 illustrates a phase change memory array according to an exemplary embodiment of the invention.

FIG. 2 shows a memory array 200 being a matrix-like arrangement of a plurality of memory cells 100.

The phase change memory array 200 comprises bit lines 201 via which electrical signals are applied to gate terminals of the switch transistors 104, to selectively turn them on or off. Furthermore, the memory array 200 comprises word lines 202 via which reading or programming currents may be applied to the phase change material structure 102 of the respective memory cells. A ground line 203 is shown as well.

In the following, some recognitions will be explained based on which exemplary embodiments of the invention have been developed.

Future memory nodes will require smaller CMOS transistors. In phase change memories, such transistors may be used as access transistors, situated in series with the phase change cell. The current to bias the transistor is scaled with the device dimensions. This factor is called scale factor s. The power required to program a phase change cell to its recess state is equal to:

$$P_{reset} = R_{cell} I^2_{reset}$$

In this equation, $P_{reset}$ the power needed to reset a cell, $R_{cell}$ is the resistance of the phase change cell and $I_{reset}$ is the current needed to reset the phase change line.

Since the maximum current provided by a transistor scales with s, the maximum generated power may scale with $s^2$. This means that, for memory nodes, the programming power may be scaled with $s^2$. This is a very aggressive scaling. If taking s=0.7, $s^2$=0.49, which means that the programming power may have to be reduced by the half every generation. Thus, power decrease is an important issue in phase change memories programming.

Figure 3:
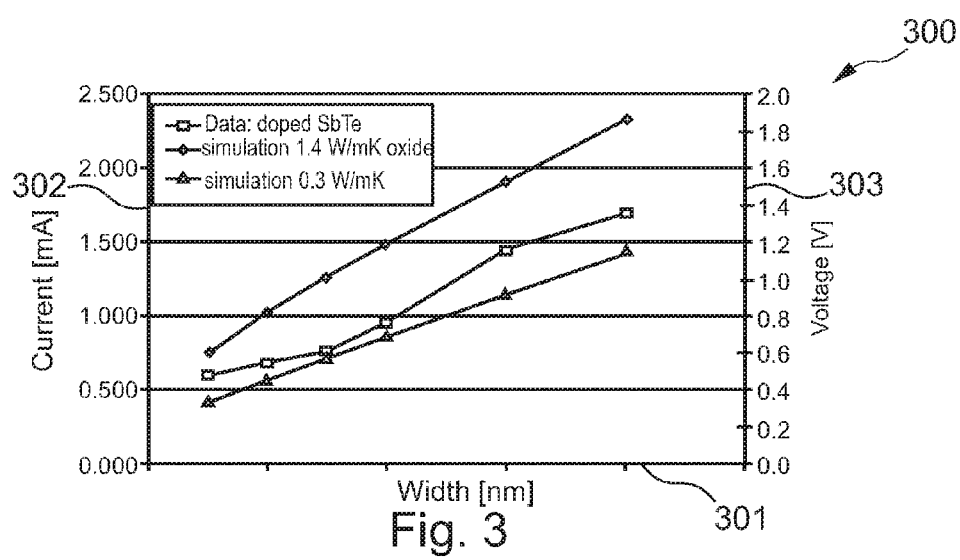
FIG. 3 is a diagram illustrating simulations regarding the dependence of a RESET current from a line width of a phase change line cell.

FIG. 3 shows a diagram 300 having an abscissa 301 along which a width of a phase change line is plotted in nanometers. Along a first ordinate 302 of the diagram 300, a programming current is plotted in milliampere, and along a second ordinate 303, the programming voltage is plotted in Volt.

FIG. 3 shows the RESET current width dependence, illustrating simulations of current scaling with line width. FIG. 3 therefore shows that in order to reduce the programming current to the half in the optimal case (dielectric heat capacitor of 0.3 WmK), a reduction of approximately 80 nm in width is required. Data shows that real devices of doped SbTe require even higher RESET currents than simulated, which makes the reduction in width more important to match transistor specifications.

In order to fit the CMOS scalability, particularly two alternatives are valid, regarding the above equation:

Increasing $R_{cell}$: Increasing the resistance of the cell with a factor s, the power in the above equation would be scaled with s.

Reducing $P_{reset}$, the required RESET power: This may decrease the power to program the cell. New materials or cell designs may have to reduce the power required to program the cell, enabling a larger scalability of the RESET power.

In view of the above consideration, exemplary embodiments of the invention provides a solution for both alternatives.

The cell resistance may be increased by reducing the phase change line width, overcoming the lithography limits. The RESET power is also reduced as a result of the new features of the cell, such as more number of squares. These features will be explained below in more detail.

The sensibility of phase change materials to further processing steps such as cleaning or patterning is an issue for the integration of the memory. A self-aligned phase change line deposition may avoid this problem, since these further processing steps are not needed in such a concept.

A concept according to an exemplary embodiment of the invention can be self-aligned, avoiding large amounts of processing related problems and improving the reliability of the manufactured devices. Another advantage of such an idea is the low cost. In principle, no extra masks are required.

Exemplary embodiments of the invention particularly have two main advantages:

The resistance of the phase change line width may be increased

The programming power may be reduced

Thus, the above considerations have shown that narrowing the line may help to increase the phase change line resistance. This reduced phase change line width cannot be further made by standard lithography techniques since the dimensions are smaller than current lithography limits. The insertion of an insulating nanopillar in the minimal (by lithography) phase change line can reduce the effective width of the line by the width of the pillar.

The number of squares of the phase change line describes the aspect ratio of the cell. One square in a phase change line may be defined as a portion of the line with a length equal to the width of the phase change line, as is shown in FIG. 4.

Figure 4:
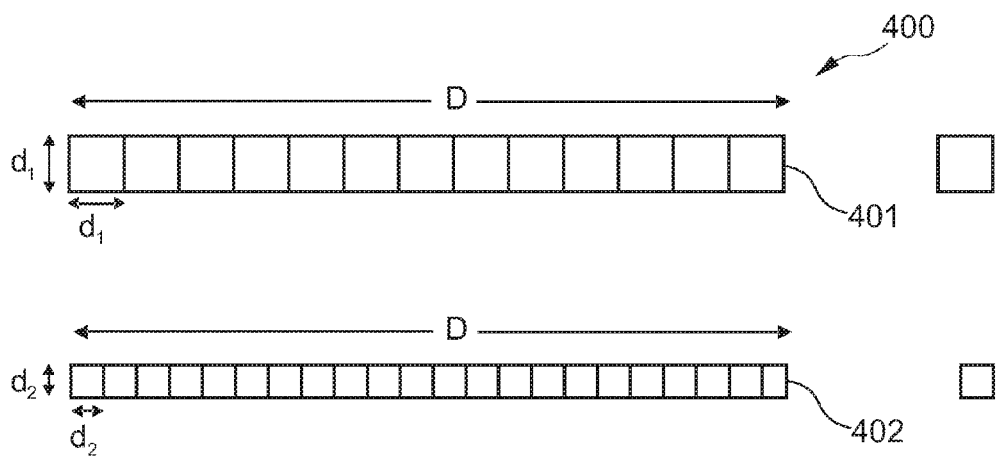
FIG. 4 illustrates an influence of a width of a phase change memory device.

FIG. 4 is a schematic illustration 400 showing a first phase change line 401 and a second phase change line 402. The two phase change lines 401, 402 are shown to have different widths, wherein $d_1 > d_2$, and both have the same length D. Therefore, there is a larger number of squares in the line 402 than in the line 401.

Figure 5:
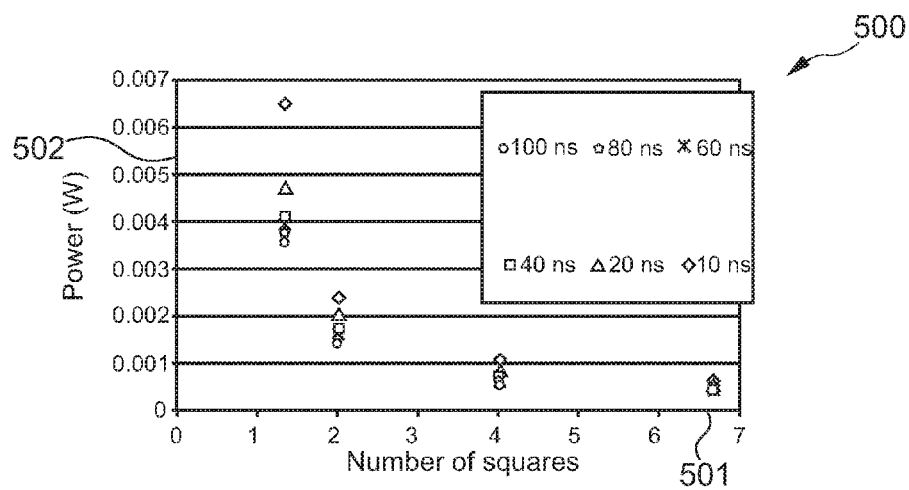
FIG. 5 is a diagram illustrating a dependence of a power for programming a line of a phase change line cell and a number of squares.

FIG. 5 illustrates a diagram 500 having an abscissa 501 along which a number of squares is plotted. Along an ordinate 502, the programming power is plotted in Watt.

Thus, FIG. 5 illustrates the RESET power versus a number of squares for 200 nm width phase change lines. Different programming pulses are used and plotted for comparison. FIG. 5 shows results regarding a doped GeSb phase change line cell of 200 nm width. It can be appreciated that the RESET power drastically decreases when the number of squares of a cell increases. The insertion of a nanopillar in a phase change line may reduce the width of the line. Then, according to the definition, the line would present more squares. More squares would lead to a reduction in the programming power as presented in FIG. 5.

Figure 6:
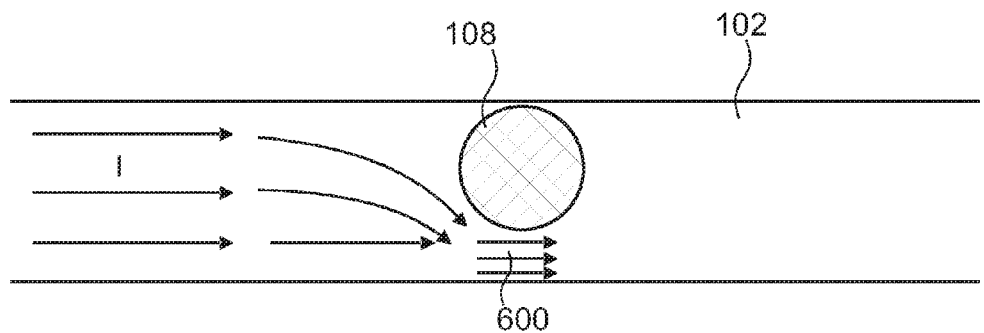
FIG. 6 schematically illustrates an effect on which embodiments of a phase change memory device according to an exemplary embodiment of the invention depends.

A principle on which embodiments of the invention are based is a current crowding resulting from a narrowing of the line, as is depicted in FIG. 6.

FIG. 6 is a schematic top view of a line cell 102 with an incrusted pillar 108. Current crowding is illustrated by reference numeral 600. The current crowding 600 is beneficial for the programming of the cells, since the current density is locally increased. This current crowding contributes to generate more local heat. If this heat is generated in the center of the line where the heat confinement is better, less current (and then power) would be needed to program the device, allowing that at scalability. The increase of the resistance of the cell is based on the reduction of its effective width that allows for a better compatibility with CMOS for future nodes.

The possibility to integrate exemplary embodiments of the invention into a self-aligned process integration may avoid problems related with the patterning of the phase change material, since these kinds of material are highly sensitive to any chemistry.

A recognition on which exemplary embodiments of the invention are based is to reduce the width of phase change lines to increase the resistance and reduce the further programming current. The phase change line width may be defined beyond the sub-lithography range by means of placing nanopillars in the minimal phase change line width drawn by lithography. These pillars can be grown (such as a nanowire) by a precursor or can be laterally etched selectively.

Figure 7:
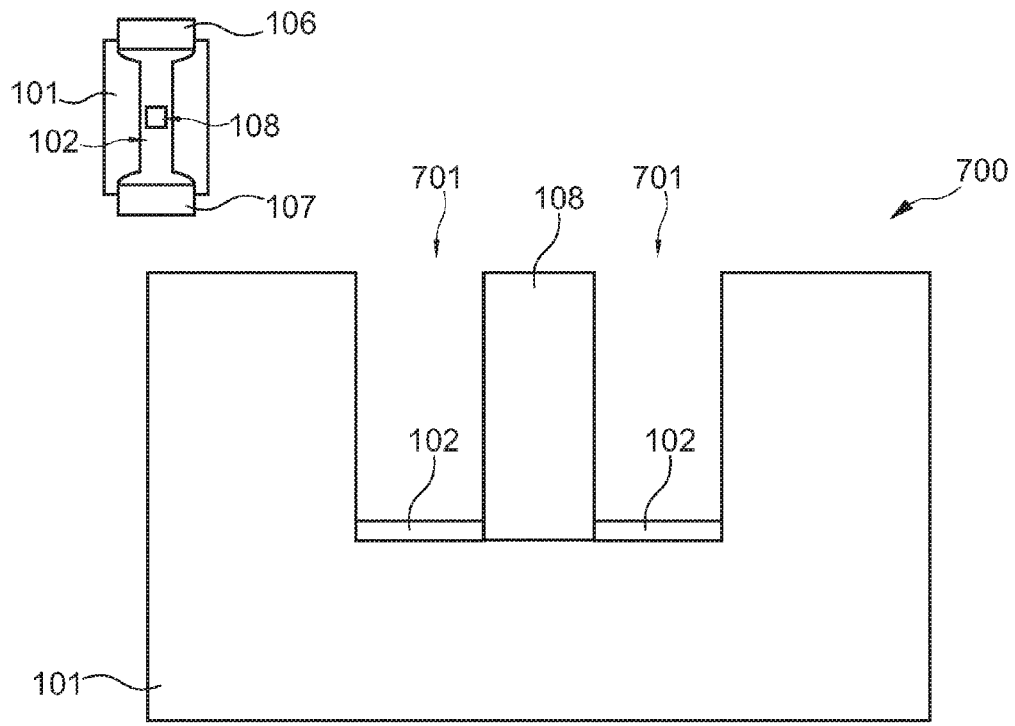
FIG. 7 to FIG. 9 show electronic devices according to exemplary embodiments of the invention.

FIG. 7 shows an electronic device 700 according to an exemplary embodiment of the invention. FIG. 7 shows a cross-sectional view as well as a plan view.

In FIG. 7, a trench 701 is formed in a substrate 101. A protrusion 108 is formed in a center of the trench 701. Phase change material 102 is provided in bottom portions of the trench 701 adjacent the protrusion 108.

Thus, the pillar 108 can be placed within an insulator trench 701. FIG. 7 shows a cross-sectional view and a top view where the pillar 108 is placed in the middle of the phase change line 102 to narrow the width of the phase change line 102 by the width of the pillar 108. The pillar 108 has been grown with a width in the trench 701 that provides insulation between adjacent memory cell lines of a memory array. The design with trenches 701 shown in FIG. 7 allows the self-aligned deposition of the phase change material 102, reducing the number of posterior processing steps thus maintaining the quality of the material.

Figure 8:
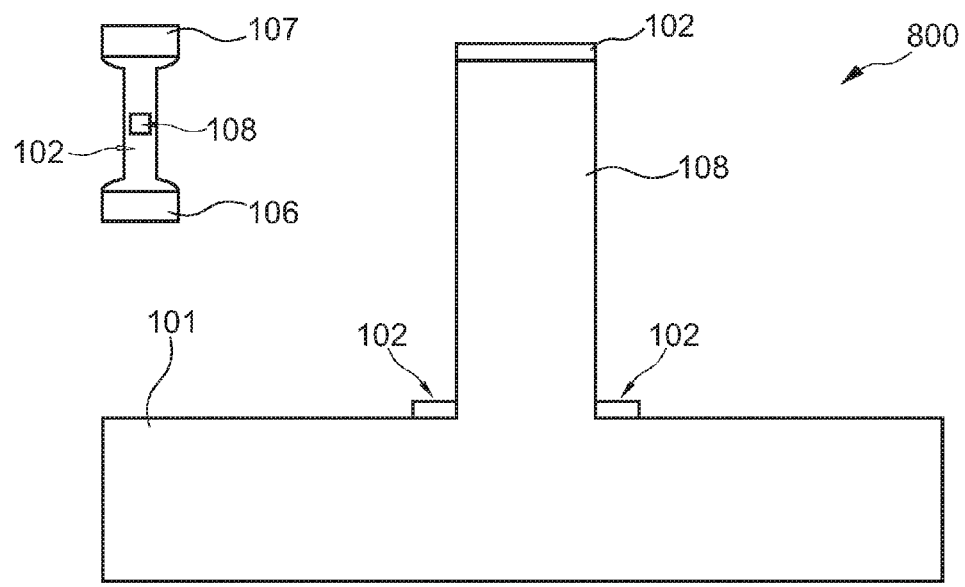

FIG. 8 shows a trenchless electronic device 800 according to an exemplary embodiment of the invention.

In FIG. 8, again a cross-sectional view and a top view are shown where the pillar 108 is placed in the middle of the phase change line 102 to narrow its width by the width of the pillar 108. The design without trenches shown in FIG. 8 is easy in manufacture. Another embodiment may be similar to FIG. 8 but enclosed in a trench.

However, for both integration processes the principle is the same: To shrink the phase change line 102 width towards the sub-lithography range.

Another embodiment of the invention uses nanopillars placed as insulation between two adjacent cells. A lateral selectively etched nanopillar is used in this case to self-align the two sub-lithographic phase change lines. Such an embodiment is shown in FIG. 9.

Figure 9:
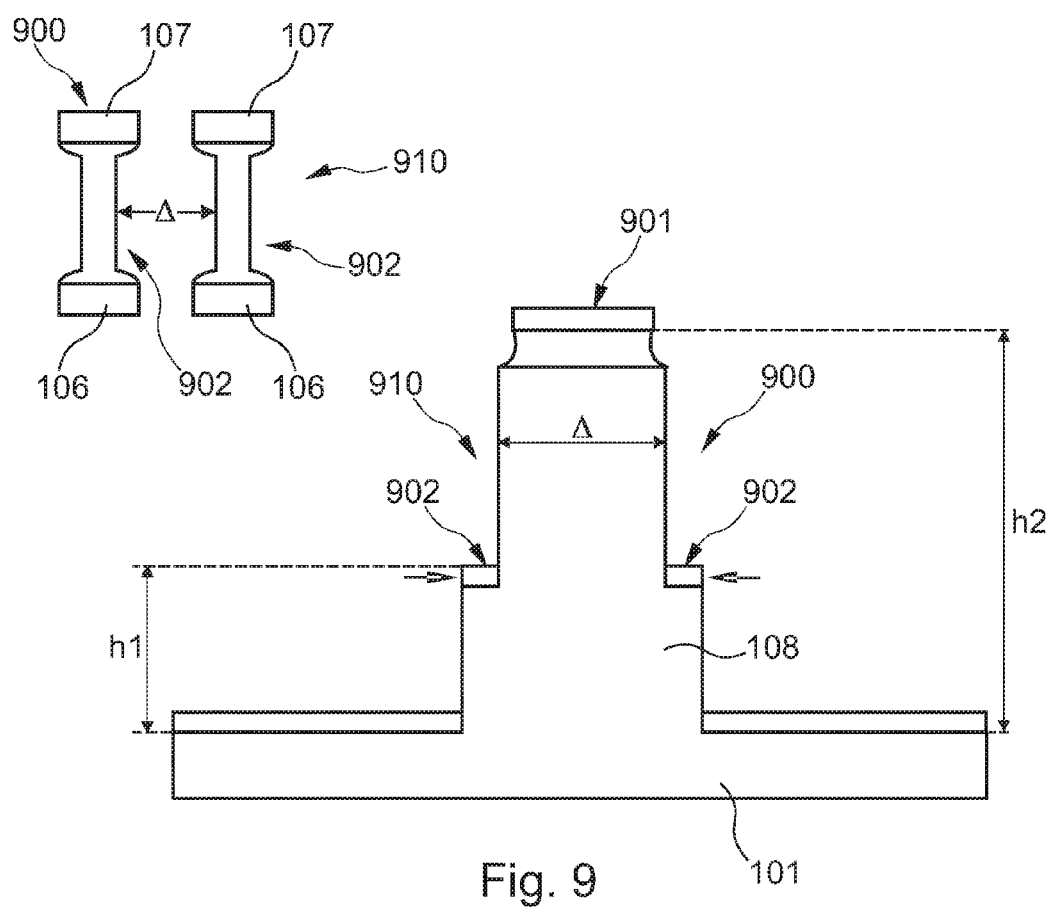

FIG. 9 shows a cross-sectional view and a top view of two phase change memory cells 900, 910 separated in this case by the pillar 108. This design allows obtaining a phase change line width which is very small, particularly in the sub-lithography range, and making the memory array more compact.

The embodiment of FIG. 9 has many advantages:

Thanks to the topography of the cell design, posterior etching steps of the deposited phase change material 102 is not needed. Therefore, the phase change line 102 width controllability is very robust.

The device 900, 910 can be manufactured with a self-aligned process.

There is no need of removing remaining phase change material 102 on top of the pillar 108 after deposition. Thus, fewer processing steps are needed and less phase change material 102 degradation occurs.

Thanks to the nanopillar 108, it is possible to construct the phase change line width as in the cases of FIG. 7 and FIG. 8.

The pillar 108 in this embodiment also provides isolation between the two lines, so that two cells 900, 910 and therefore two bits of storage capacity may be obtained.

In FIG. 9, the protrusion 108 is a stepped structure having steps 902 at a first height h1 above the substrate 101 and having a plateau 901 at a second height h2 above the substrate 101, wherein the second height h2 is larger than the first height h1, and the convertible structure 102 is arranged on the steps 902.

Both ends of the line cells 900, 910 are in contact with the metallic electrodes 106, 107. Like that the cells 900, 910 can be electrically accessed and current can be applied through the memory cells 900, 910.

Any material, shape and quantity of pillars 108 can be used to decrease the width of the phase change cells 900, 910. Arrays can be built with the designs mentioned in the various embodiments. The pillar 108 can be grown or selectively etched. A nanotube can be used instead of a nanopillar.

In the following, referring to FIG. 10 to FIG. 17, a method of manufacturing the electronic device 700 of FIG. 7 will be described.

Figure 10:
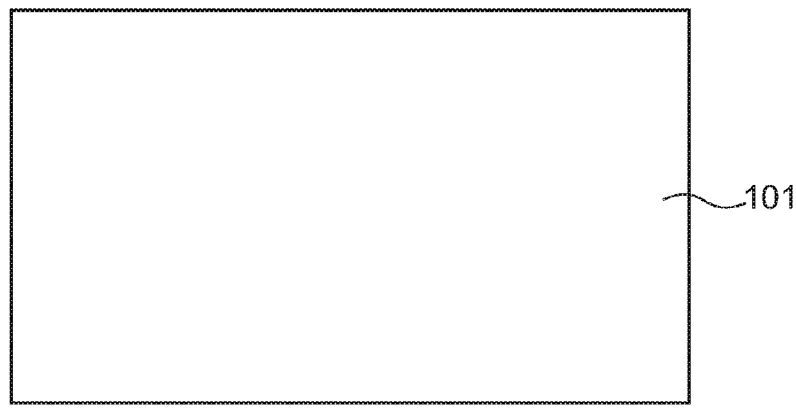
FIG. 10 to FIG. 17 show layer sequences obtained during manufacture of the electronic device of FIG. 7.

As can be taken from FIG. 10, the method starts with an insulator substrate 101 in the back end.

Figure 11:
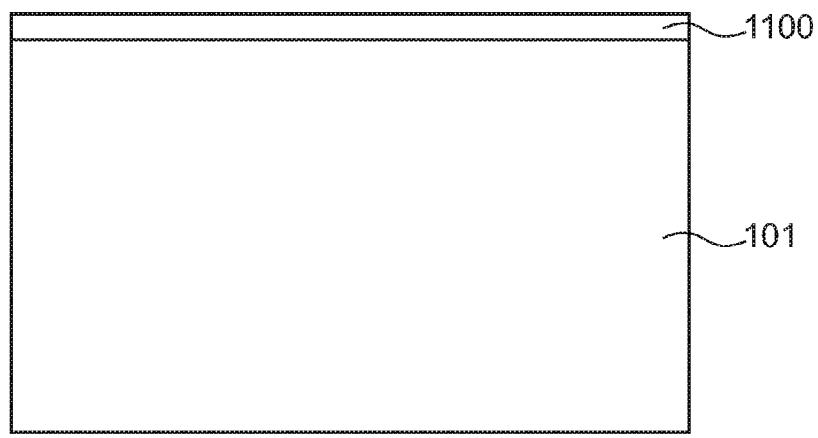

A hard mask 1100 is deposited on the substrate 101, as can be taken from FIG. 11.

Figure 12:
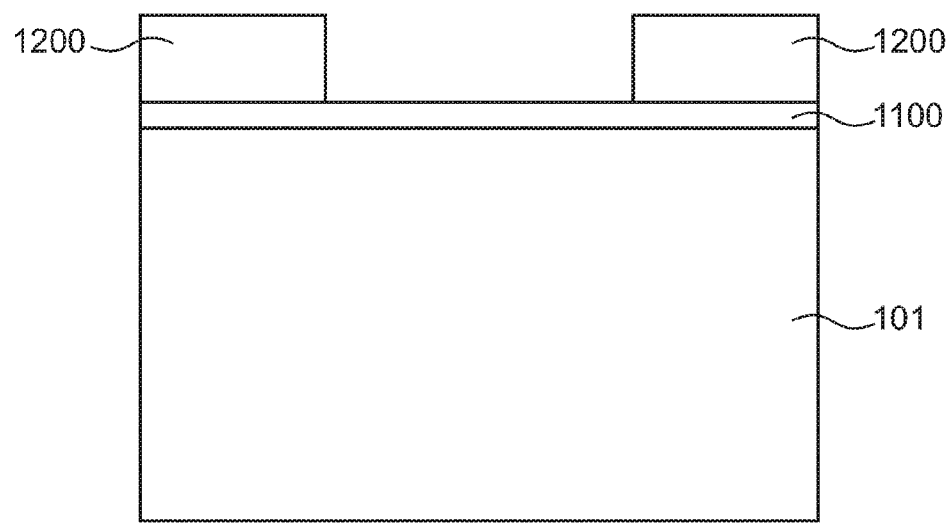

As can be taken from FIG. 12, a resist 1200 is deposited on the hard mask 1100 and is patterned by a lithography procedure.

Figure 13:
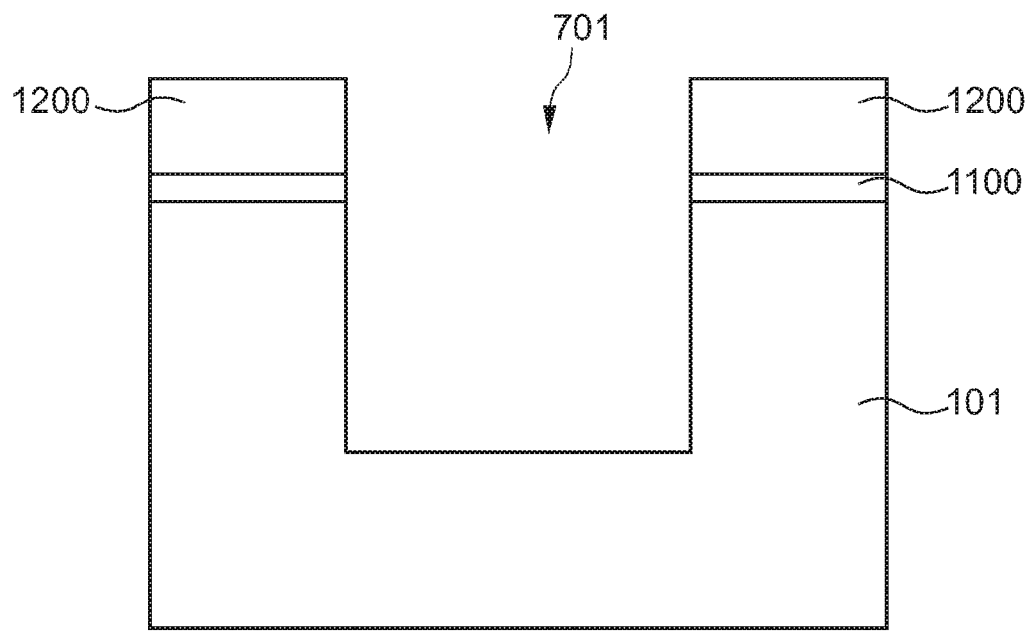

As can be taken from FIG. 13, a trench 701 is etched in the hard mask 1100 and in the insulator substrate 101, so that the hard mask 1100 and the insulator 101 are removed in an exposed portion where there is no resist 1200.

Figure 14:
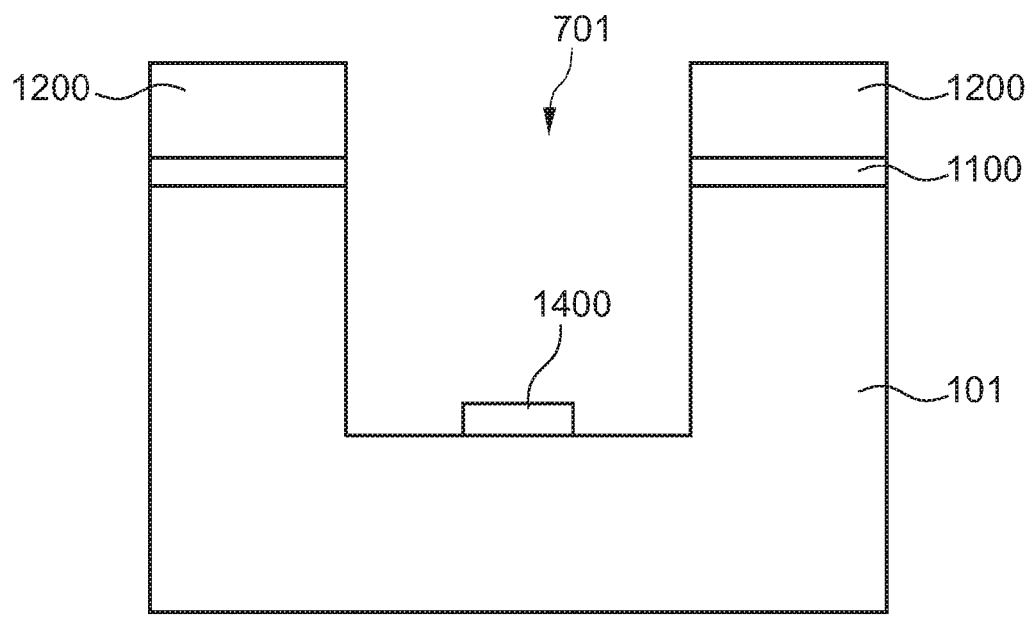

As can be taken from FIG. 14, a precursor 1400 is deposited in the trench 701 as a basis to grow the nanopillar 108 subsequently.

Figure 15:
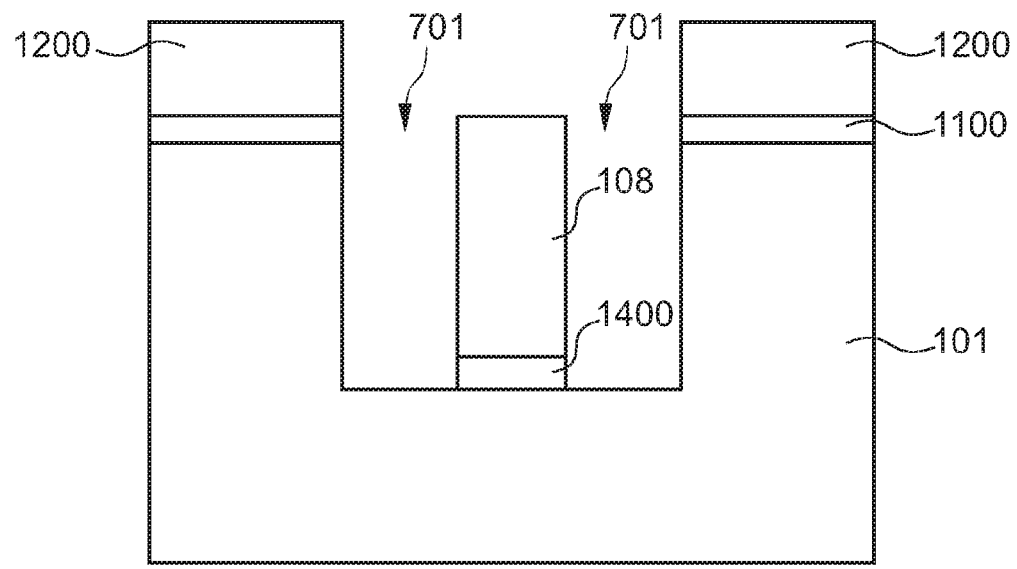

As can be taken from FIG. 15, the nanopillar 108 is formed on the precursor 1400.

Figure 16:
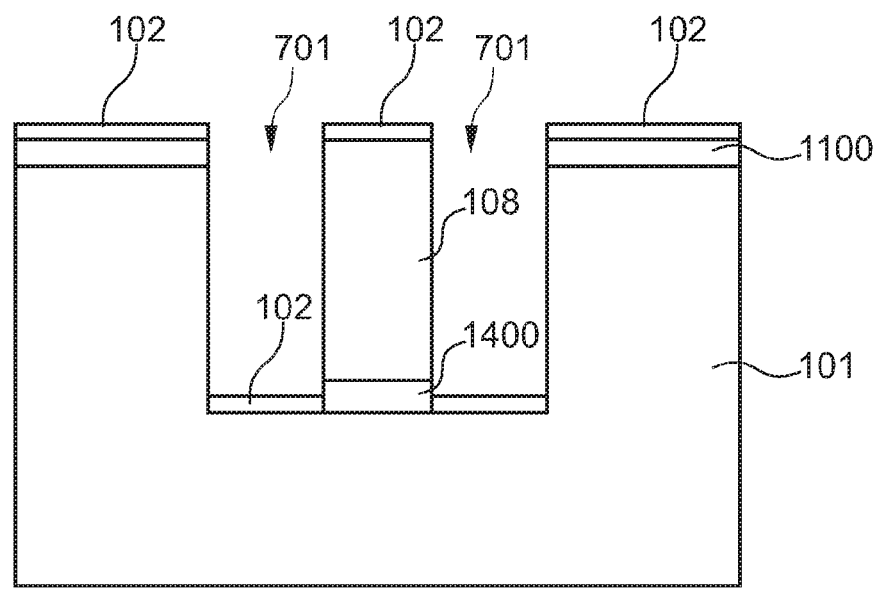

As can be taken from FIG. 16, the resist 1200 is removed, and the phase change material 102 is deposited. There will not be any phase change material on the vertical walls of the protrusion 108, since the vertical side walls are very high and steep (for instance may have a very high aspect ratio of, for example, at least 8).

Figure 17:
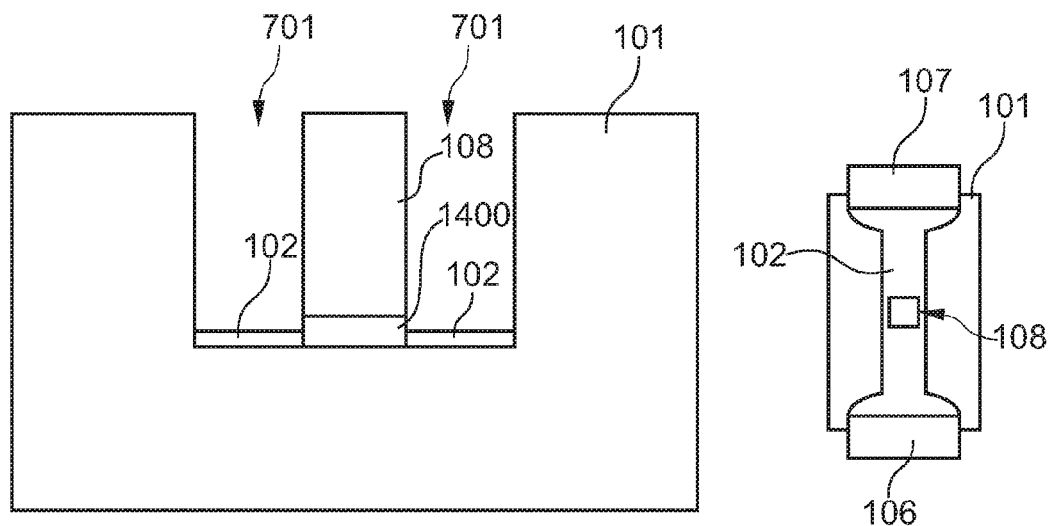

As can be taken from FIG. 17, a CMP procedure (chemical mechanical polishing) is performed, which will stop on the hard mask 1100.

In the following, referring to FIG. 18 to FIG. 23, a method of manufacturing the electronic device 800 shown in FIG. 8 will be explained.

Figure 18:
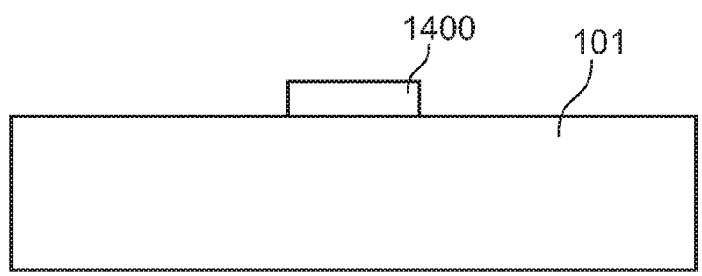
FIG. 18 to FIG. 23 show layer sequences obtained during manufacture of the electronic device of FIG. 8.

Again, as can be taken from FIG. 18, an insulator substrate 101 is provided on which a precursor 1400 is formed.

Figure 19:
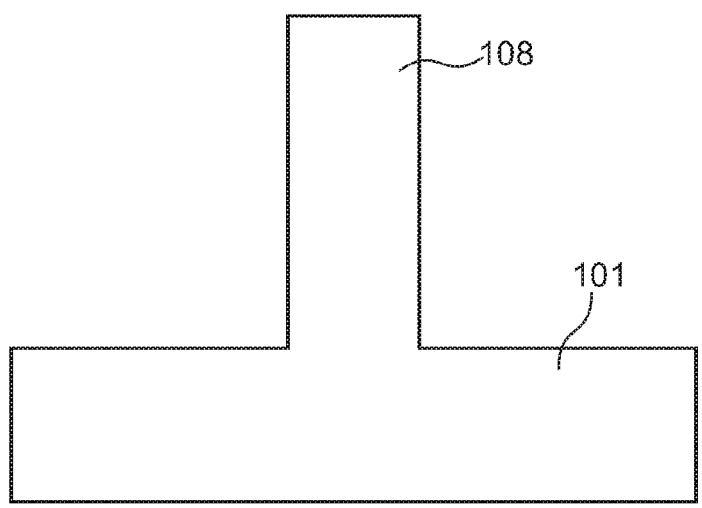

As can be taken from FIG. 19, a pillar 108 is grown on the precursor 1400. The precursor 1400 may be removed (or may be still be part of the pillar 108).

Figure 20:
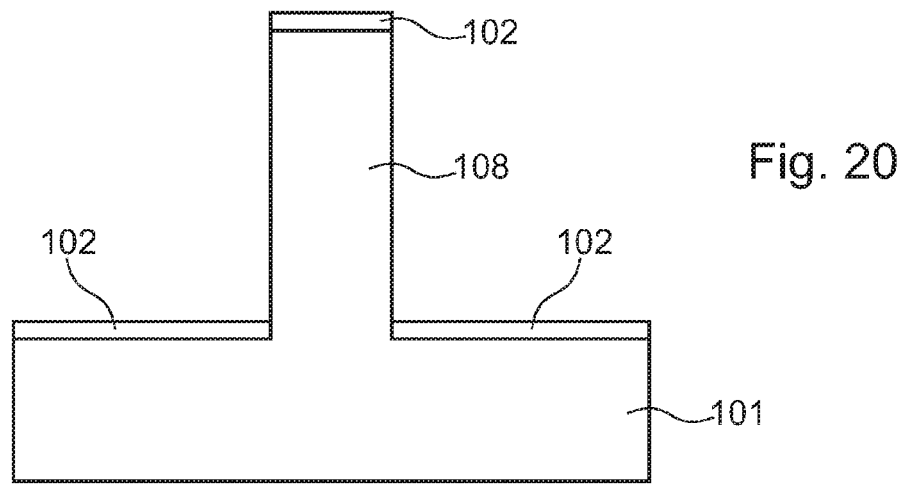

As can be taken from FIG. 20, phase change material 102 is deposited on the surface of the layer sequence shown in FIG. 19.

Figure 21:
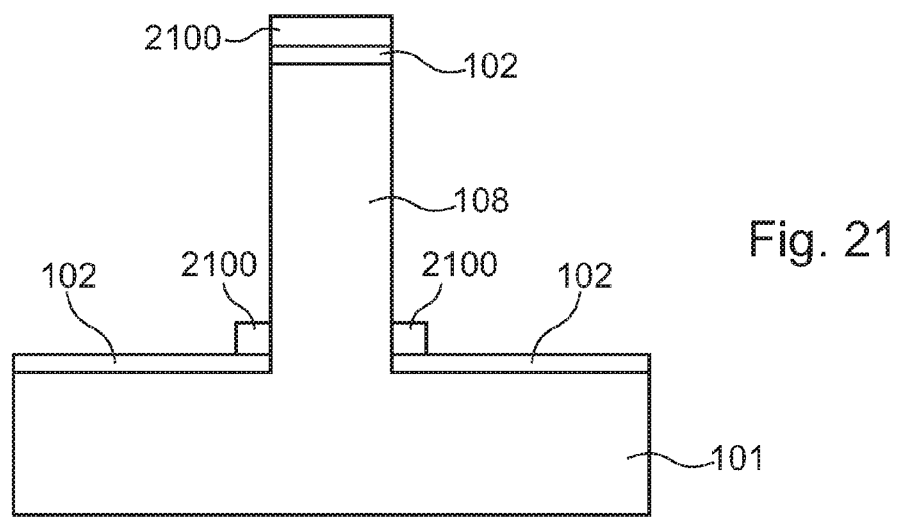

To obtain the layer sequence shown in FIG. 21, a resist 2100 is deposited. The resist 2100 is available in the phase change processing to define the phase change cell of about 100 nm width. For instance, if the pillar 108 has a width of about 40 nm, then the remaining phase change material 102 at both sides is about 30 nm each.

Figure 22:
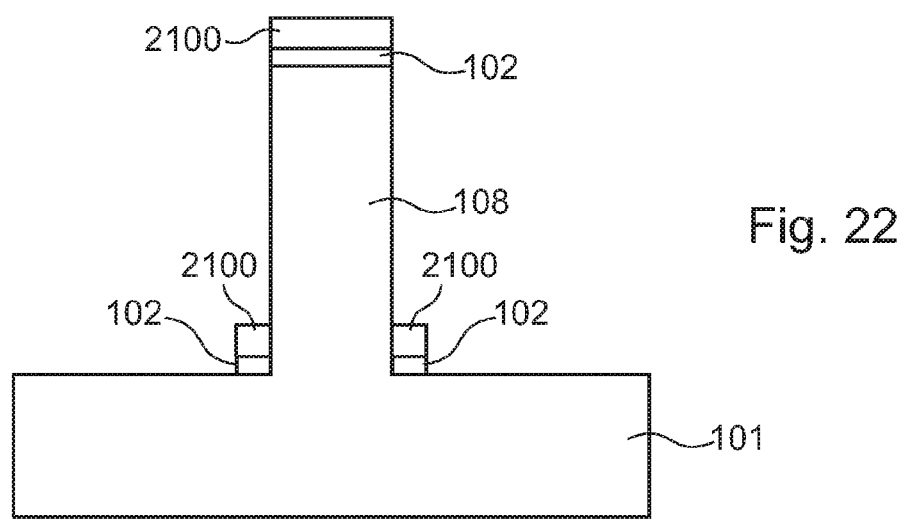

As can be taken from FIG. 22, exposed portions of the phase change material 102 are removed everywhere where it is not covered by the patterned resist 2100.

Figure 23:
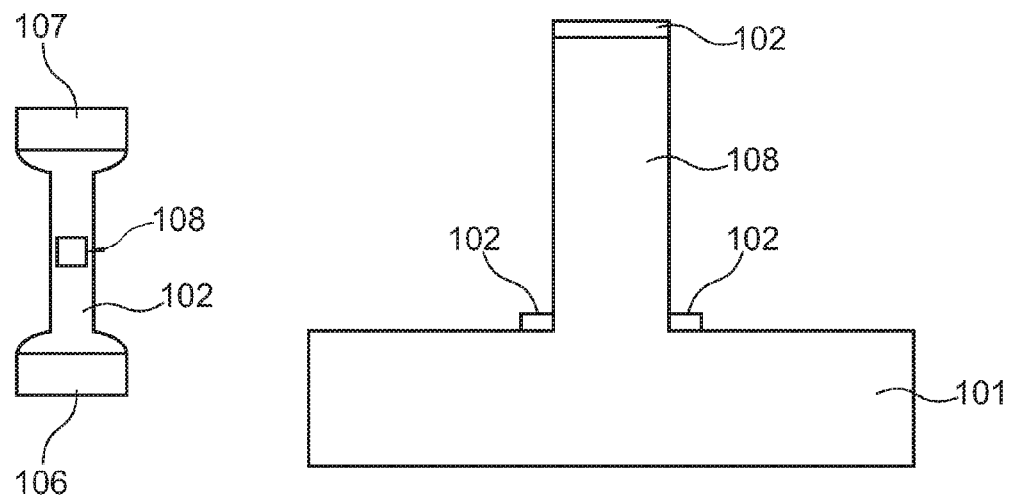

As can be taken from FIG. 23, the resist 2100 is removed.

Next, referring to FIG. 24 to FIG. 32, a method of manufacturing the electronic device 900 shown in FIG. 9 will be described.

Figure 24:
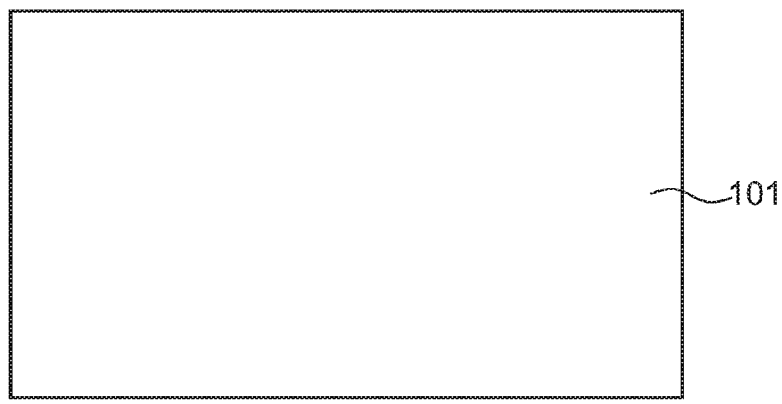
FIG. 24 to FIG. 32 show layer sequences obtained during manufacture of the electronic device of FIG. 9.

Again, as can be taken from FIG. 24, the method starts with an insulator substrate 101 in the back end.

Figure 25:
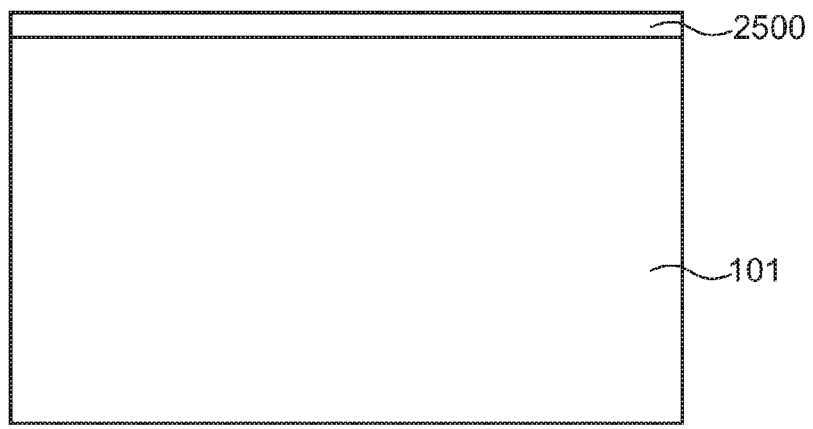

As can be taken from FIG. 25, a hard mask 2500 is deposited on the insulating substrate 101.

Figure 26:
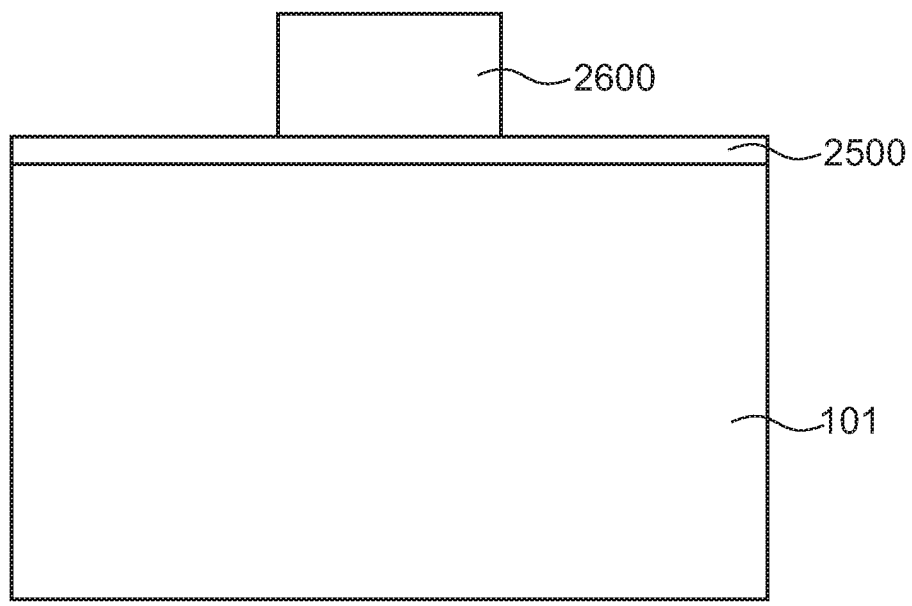

As can be taken from FIG. 26, a resist 2600 is deposited and patterned on the hard mask 2500, pre-defining lateral dimensions of the pillar 108 to be formed subsequently.

Figure 27:
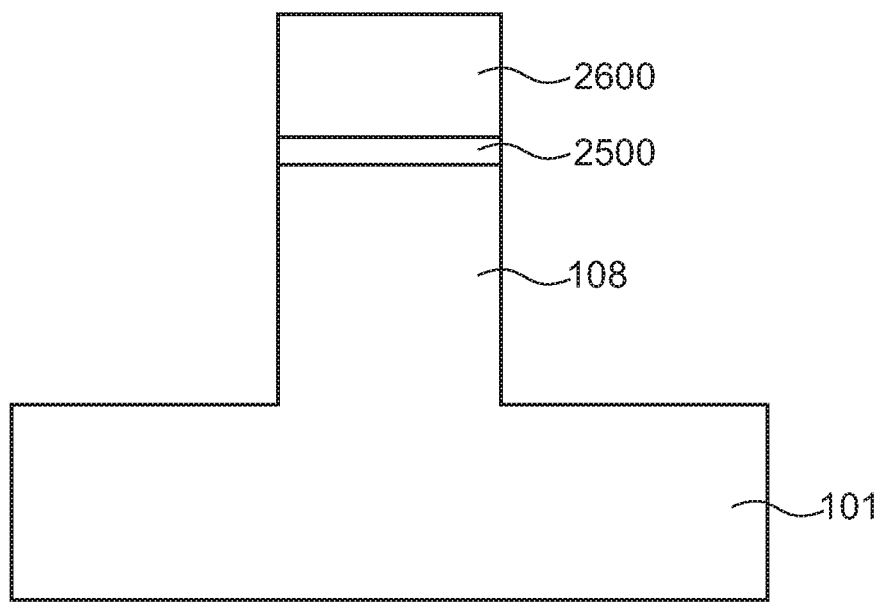

As can be taken from FIG. 27, everywhere where there is no resist 2600, material of the hard mask 2500 and of the insulating substrate 101 is removed by etching.

Figure 28:
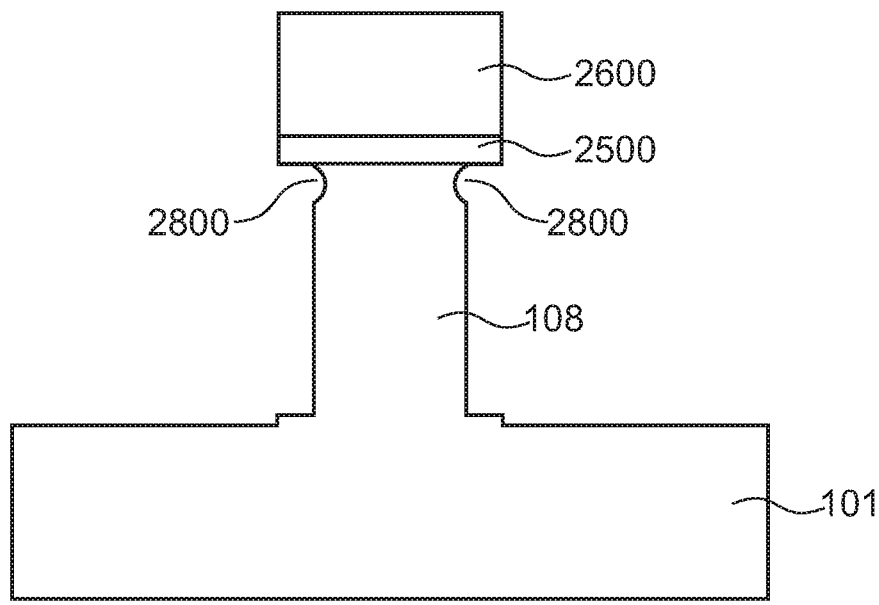

As can be taken from FIG. 28, an etch step selective to the insulator material 101 is performed. This may also remove some portion of the insulator 101, which is not the pillar 108. Also, recesses 2800 between the pillar 108 and the hard mask 2500 may be formed by such a procedure.

Figure 29:
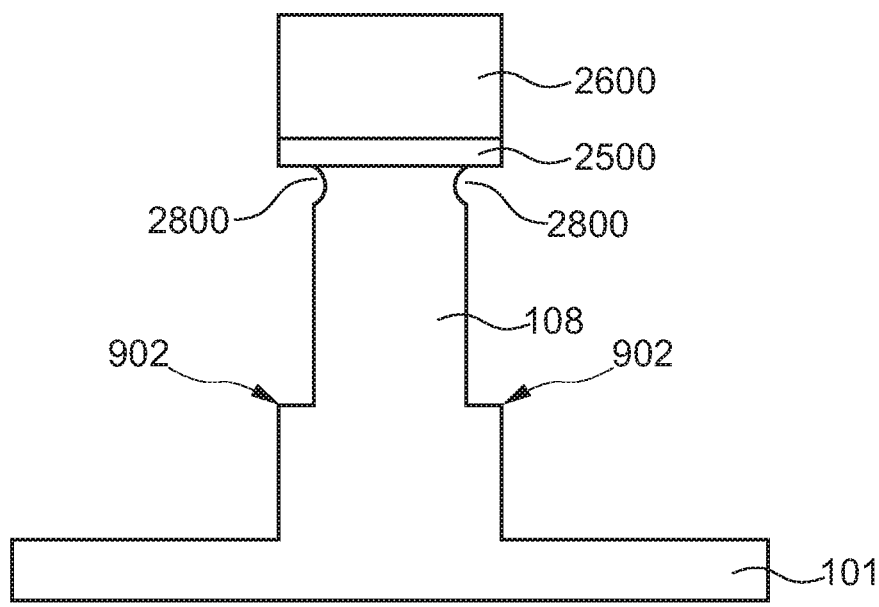

As can be taken from FIG. 29, a physical vertical etch is performed, thereby generating the steps 902.

Figure 30:
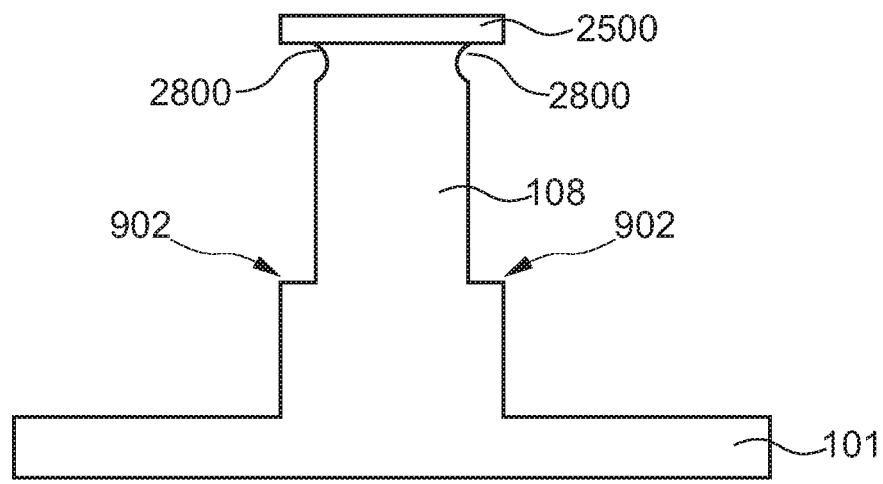

Subsequently, as can be taken from FIG. 30, the resist 2600 is removed.

Figure 31:
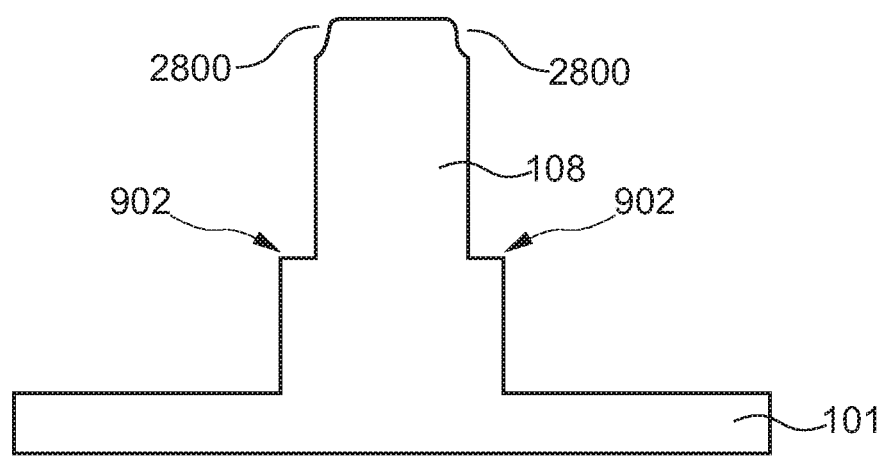

In order to obtain a layer sequence shown in FIG. 31, the hard mask 2500 is removed by a chemical etch or by CMP stopping in the hard mask 2500. The CMP can also be done thanks to the periodicity of the pillars 108 along the wafer (in the case of an array of memory cells).

Figure 32:
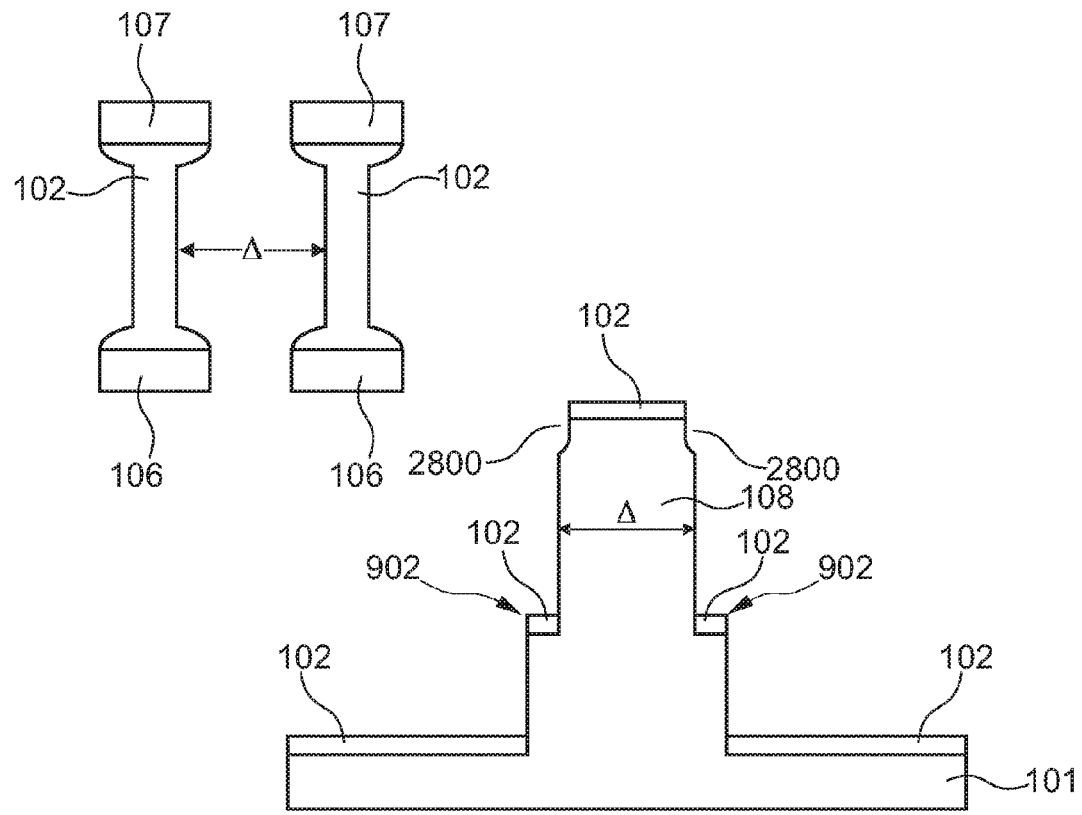

As can be taken from FIG. 32, the phase change material 102 is now deposited. The phase change material 102 will not be deposited on the vertical walls of the pillar 108, since they can be quite high and steep. Thus, as can also be taken from the top view of FIG. 32, two different lines can be manufactured which are spaced at a distance Δ from one another.

Figure 33:
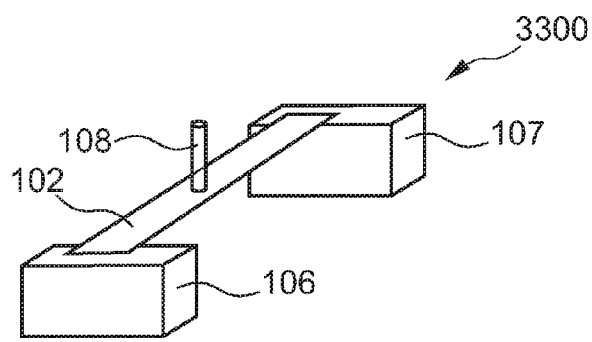
FIG. 33 illustrates an electronic memory cell device according to another exemplary embodiment of the invention.

FIG. 33 shows a three-dimensional view of a memory cell 3300 according to an exemplary embodiment of the invention.

As can be taken from FIG. 33, the electrodes 106, 107 are placed horizontally. The pillar 108 is a silicon oxide insulator within the planar phase change line 102 (the horizontal line of FIG. 33). Thus, embodiments of the invention use a horizontal phase change line 102. A sub-lithography insulator pillar 108 may be grown in the middle of such a line 102, sufficiently far from the contacts 106, to reduce the electrical width of said line.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. An electronic device, the electronic device comprising
a substrate;
a convertible structure arranged on or in the substrate and arranged between two electrodes for providing path for current to flow from one to the other of the two electrodes, the convertible structure being convertible between at least two states by heating and having different electrical properties in different ones of the at least two states, wherein the convertible structure has a first portion having a first width, and has a second portion having a second width, the second width being smaller than the first width;
a protrusion protruding through the convertible structure configured and arranged to narrow the second portion of the convertible structure from the first width to the second width by way of the second portion constricting an intermediate section of the current path in the convertible structure and between the two electrodes;
wherein the convertible structure is a thermo-dependent structure, particularly a phase change structure which is convertible between at least two phase states, and further including an electric sensing circuit configured and arranged for sensing electrical properties of the convertible structure and for switching between different ones of said at least two states; and
wherein the convertible structure is electrically conductive between the two electrodes in at least one in the at least two states, and wherein except for the second portion, the path for current to flow from one to the other of the two electrodes is provided uniformly by the first width.

2. The electronic device according to claim 1, comprising an electric sensing circuit adapted for sensing the different electrical properties of the convertible structure in different ones of the at least two states.

3. The electronic device according to claim 1, wherein the convertible structure is adapted such that a value of the electrical conductivity differs between the at least two states.

4. The electronic device according to claim 1, wherein the convertible structure is adapted such that one of the at least two states relates to a crystalline phase and another one of the at least two states relates to an amorphous phase of the convertible structure.

5. The electronic device according to claim 1, comprising a switch, particularly one of the group consisting of a transistor, a field effect transistor, a bipolar transistor, a FinFet, and a diode, electrically coupled to the convertible structure.

6. The electronic device according to claim 1, comprising a first electrode and a second electrode, the convertible structure being electrically connected between the first electrode and the second electrode.

7. The electronic device according to claim 1, wherein the convertible structure is arranged on and/or in the substrate in a planar manner.

8. The electronic device according to claim 1, wherein the protrusion is aligned vertically with respect to the substrate and/or with respect to the convertible structure.

9. The electronic device according to claim 1, wherein the protrusion protrudes through a central portion of the convertible structure to thereby form an island within the convertible structure.

10. An electronic device, the electronic device comprising
a substrate;
a convertible structure arranged on or in the substrate and arranged between two electrodes for providing path for current to flow from one to the other of the two electrodes, the convertible structure being convertible between at least two states by heating and having different electrical properties in different ones of the at least two states, wherein the convertible structure has a first portion having a first width, and has a second portion having a second width, the second width being smaller than the first width; and
a protrusion protruding through the convertible structure configured and arranged to narrow the second portion of the convertible structure from the first width to the second width by way of the second portion constricting an intermediate section of the current path in the convertible structure and between the two electrodes; and
wherein the protrusion is arranged as a line to separate the convertible structure into two electrically decoupled lines.

11. The electronic device according to claim 10, wherein the protrusion comprises an electrically insulating material.

12. An electronic device, the electronic device comprising
a substrate;
a convertible structure arranged on or in the substrate, being convertible between at least two states by heating and having different electrical properties in different ones of the at least two states, wherein the convertible structure has a first portion having a first width, and has a second portion having a second width, the second width being smaller than the first width;
a protrusion protruding, including a nanowire grown on the substrate, through the convertible structure to thereby narrow the second portion of the convertible structure from the first width to the second width.

13. The electronic device according to claim 12, wherein the nanowire comprises one of the group consisting of a semiconductor nanowire, a carbon nanotube, a silicon nanowire, and a group III-group V nanowire.

14. The electronic device according to claim 1, wherein the protrusion comprises a lithographically manufactured structure.

15. The electronic device according to claim 1, wherein the substrate has a trench in which the protrusion and the convertible structure are formed.

16. The electronic device according to claim 1, wherein the protrusion and the convertible structure are formed in a trenchless portion of the substrate.

17. An electronic device, the electronic device comprising
a substrate;
a convertible structure arranged on or in the substrate, being convertible between at least two states by heating and having different electrical properties in different ones of the at least two states, wherein the convertible structure has a first portion having a first width, and has a second portion having a second width, the second width being smaller than the first width;
a protrusion protruding through the convertible structure to thereby narrow the second portion of the convertible structure from the first width to the second width, wherein the protrusion is a stepped structure having at least one step at a first height above the substrate and having a plateau at a second height above the substrate, the second height being larger than the first height, wherein the convertible structure is arranged on the at least one step.

18. An electronic device, the electronic device comprising:
a substrate;
a convertible structure arranged on or in the substrate and arranged between two electrodes for providing path for current to flow from one to the other of the two electrodes, the convertible structure being convertible between at least two states by heating and having different electrical properties in different ones of the at least two states, wherein the convertible structure has a first portion having a first width, and has a second portion having a second width, the second width being smaller than the first width; and
a protrusion protruding through the convertible structure configured and arranged to narrow the second portion of the convertible structure from the first width to the second width by way of the second portion constricting an intermediate section of the current path in the convertible structure and between the two electrodes; and
a plurality of protrusions protruding through different portions of the convertible structure.

19. The electronic device according to claim 1, wherein the convertible structure comprises a lithographically manufactured structure.

20. The electronic device according to claim 1, adapted as one of the group consisting of a memory device, a memory array, an actuator, a microelectromechanical structure, a controller, and a switch.

21. A method of manufacturing an electronic device, the method comprising
arranging a convertible structure on and/or in a substrate between two electrodes for providing a path for current to flow from one to the other of the two electrodes, the convertible structure being convertible between at least two states by heating and having different electrical properties in different ones of the at least two states;
forming the convertible structure to have a first portion having a first width and to have a second portion having a second width, the second width being smaller than the first width;
forming a protrusion protruding through the convertible structure to narrow the second portion of the convertible structure from the first width to the second width by way of the second portion constricting an intermediate section of the current path in the convertible structure and between the two electrodes; and
forming a plurality of protrusions protruding through different portions of the convertible structure.

22. The method according to claim 21, wherein the protrusion is formed by at least one of the following: growing, depositing, or etching.

* * * * *